United States Patent [19]

Maemoto et al.

[11] Patent Number: 5,395,733
[45] Date of Patent: Mar. 7, 1995

[54] IMAGE FORMING LAYER

[75] Inventors: Kazuo Maemoto; Kouichi Kawamura, both of Shizuoka, Japan

[73] Assignee: Fuji Photo Film Co., Ltd., Minami-ashigara, Japan

[21] Appl. No.: 697,971

[22] Filed: May 10, 1991

[30] Foreign Application Priority Data

May 15, 1990 [JP] Japan .................................. 2-125149

[51] Int. Cl.$^6$ .............................................. G03C 1/492
[52] U.S. Cl. ..................................... 430/270; 430/285; 430/287; 430/910; 522/904; 522/905
[58] Field of Search ............... 430/270, 287, 285, 910, 430/926, 284; 522/904, 905

[56] References Cited

U.S. PATENT DOCUMENTS

| | | | |
|---|---|---|---|
| 3,591,661 | 7/1971 | Rogers | 260/897 |
| 3,748,144 | 7/1973 | Ford | 96/115 R |
| 4,046,577 | 9/1977 | Muzyczko et al. | 96/115 R |
| 4,348,530 | 9/1982 | Kvita et al. | 549/27 |
| 4,946,761 | 8/1990 | Maemoto | 430/270 |
| 5,130,392 | 7/1992 | Schwalm et al. | 526/288 |
| 5,227,279 | 7/1993 | Kawabata et al. | 430/281 |

*Primary Examiner*—Steve Rosasco
*Attorney, Agent, or Firm*—Burns, Doane, Swecker & Mathis

[57] ABSTRACT

An image forming layer comprising a polymer which has a component showing UV absorption at 320 nm or higher and a component containing the carboxylic acid (carboxylate) group represented by the following general formula I:

$$-(Y)_l-X-(CH_2)_k-COOT \quad (I)$$

wherein X represents sulfur, oxygen, single bond, C=W or N—U where W represents oxygen or sulfur and U represents an optionally substituted aryl, alkyl group or hydrogen, Y represents an optionally substituted alkylene, arylene, aralkylene group or divalent heterocyclic ring, and T represents a hydrogen, alkali metal, alkaline earth metal or $HN(R^1)(R^2)(R^3)$ where $R^1$, $R^2$ and $R^3$, which may be identical or different, independently represent a hydrogen atom, optionally substituted alkyl or aryl group and $R^1$, $R^2$ and $R^3$ may join together to form a ring structure, k represents 0 or 1 and 1 is 0 or 1, provided that X represents C=W when k is 0. The image forming layer shows an extremely high sensitivity and excellent scratch resistance of the image areas upon development.

20 Claims, No Drawings

IMAGE FORMING LAYER

BACKGROUND OF THE INVENTION

1. Field of the Invention

The present invention relates to a novel image forming layer, and more precisely it relates to an image forming layer enabling to obtain a negative image with high sensitivity from original image by light exposure.

2. Prior Arts

Recently, the development process in the formation of printing plates or resists has been carried out by the alkali development using an aqueous alkaline solution instead of the former development using a developer mainly consisting of an organic solvent from the viewpoints of the environmental safety and sanitary. Accordingly, it has been required to use a light-sensitive layer suitable for the alkali development, and various binder polymers or resins containing carboxyl groups are utilized. However, such binder compounds have serious drawbacks that when they are used in printing plates or resists the image portions obtained after the light exposure and the development tend to swell with the alkaline developer due to the carboxylic acid remained therein to unacceptable reduce the coating strength and the adhesion to the substrate of the image portions.

In order to eliminate those drawbacks, it was proposed to eliminate the carboxylic acid by decarbonation of the carboxylic acid by means of light exposure as disclosed in JP (KOKAI) No. 64-32255. However, this method enables to obtain only low sensitivity, and the image portions obtained with a weak light exposure in this method show poor scratch resistance during the development process since a lot of carboxylic acid remains in the image portions when the light exposure is rather weak.

SUMMARY OF THE INVENTION

Therefore, the object of the invention is to provide a image forming layer showing high sensitivity and excellent scratch resistance during the development process and free from the aforementioned drawbacks.

We have conducted various studies to achieve the foregoing object and finally found that it can be achieved by an image forming layer comprising a polymer introduced into a single molecule thereof with a component showing UV absorption at 320 nm or higher and a component containing a carboxylic acid (carboxylate) residue represented by the following general formula I.

Therefore, the present invention provides an image forming layer comprising a polymer which has a component showing UV absorption at 320 nm or higher and a component containing the carboxylic acid (carboxylate) group represented by the following general formula I:

$$-(Y)_l-X-(CH_2)_k-COOT \qquad (I)$$

wherein X represents sulfur, oxygen, single bond, $C=W$ or $N-U$ where W represents oxygen or sulfur and U represents an optionally substituted aryl, alkyl group or hydrogen, Y represents an optionally substituted alkylene, arylene, aralkylene group or divalent heterocyclic ring, and T represents a hydrogen, alkali metal, alkaline earth metal or $HN(R^1)(R^2)(R^3)$ where $R^1$, $R^2$ and $R^3$, which may be identical or different, independently represent a hydrogen atom, optionally substituted alkyl or aryl group and $R^1$, $R^2$ and $R^3$ may join together to form a ring structure, k represents 0 or 1 and 1 is 0 or 1, provided that X represents $C=W$ when k is 0.

DETAILED EXPLANATION OF THE INVENTION

The present invention will be described in more detail hereunder.

The polymer used in the present invention is introduced with the moiety containing the carboxyl group which may be decarbonated by light exposure and is represented by the above-mentioned general formula I (referred to as a "carboxyl group-containing moiety" hereinafter) and the moiety showing UV absorption at 320 nm or higher (referred to as a "sensitizer moiety" hereinafter).

In the general formula I, U preferably represents an aryl group containing 6 to 20 carbon atoms such as phenyl and naphthyl or an alkyl group containing 1 to 20 carbon atoms. Examples of the substituent of those aryl and alkyl groups may include a halogen atom such as fluorine, chlorine, bromine and iodine atoms, cyano, nitro, hydroxyl, carboxyl groups, —OR, —COOR, —OCOR, —CONHR, —NHCOR where R represents an alkyl group containing 1 to 20 carbon atoms or aryl group containing 6 to 20 carbon atoms, aryl group as the substituent of the alkyl group and alkyl group as the substituent of the aryl group. As to the group Y, the alkylene group preferably contains 1 to 20 carbon atoms, the arylene group preferably contains 6 to 20 carbon atoms and the aralkylene group preferably contains 7 to 20 carbon atoms, and the divalent heterocyclic ring group is preferably a divalent group derived from a carbazole, indole or pyrazole ring. Examples of the substituent of those alkylene, arylene, aralkylene and divalent heterocyclic ring include those mentioned above as the substituent of the group U.

Examples of the alkyl and aryl groups of $R^1$, $R^2$ and $R^3$ and the substituent thereof respectively include those mentioned as the group U and therefor.

Preferred examples of the carboxyl group-containing moiety include those having a residue or residues of indole-3-acetic acid, phenoxyacetic acid, 2-methylphenoxyacetic acid, 3-methoxyphenoxyacetic acid, 2-nitrophenoxyacetic acid, 3-chlorophenoxyacetic acid, 4-methylphenoxyacetic acid, n-butoxyacetic acid, thiophenoxyacetic acid, 3-methoxythiophenoxyacetic acid, 2-chlorothiophenoxyacetic acid, 2-methylthiophenoxyacetic acid, 4-nitrothiophenoxyacetic acid, n-butylthioacetic acid, phenylacetic acid, 2-nitrophenylacetic acid, 4-nitrophenylacetic acid, 2,4-dinitrophenylacetic acid, benzoylformic acid, 4-chlorobenzoylformic acid, thiobenzoylformic acid, pyruvic acid, N-phenylglycine, N-(3-chlorophenyl)glycine, N-(2,4-dichlorophenyl)glycine, N-(4-acetylphenyl)glycine, N-(2-nitrophenyl)glycine, N-(2,4-dinitrophenyl)glycine, N-(4-cyanophenyl)glycine, N-(2-bromophenyl)glycine, N-(2-methylphenyl)glycine, N-(2-methoxyphenyl)glycine, N-(2,4-dimethoxyphenyl)glycine, N-(n-butylphenyl)glycine, N-methyl-N-(2-methylphenyl)glycine, N-methyl-N-(2-chlorophenyl)glycine, N-methyl-N-(2-nitrophenyl)glycine, N-methyl-N-(2-methoxyphenyl)glycine, N-(4-carbamoylphenyl)glycine and N-(4-sulfamoylphenyl)glycine. The carboxyl group-containing moiety may be used in any combination of two or more different types thereof.

The carboxylic acid residue may be a carboxylate, i.e., a carboxylic acid salt residue. The carboxylic acid salt may be an alkali metal salt, alkaline earth metal salt, ammonium salt and the like, but it is not limited to them. Examples of the ammonium salt include those formed with an amine such as mono-, di- or trimethylamine, mono-, di- or triethylamine, mono-, di- or triisopropylamine, n-butylamine, mono-, di- or triethanolamine, mono-, di- or triisopropanolamine, ethyleneimine, ethylenediimine, N,N-diethylaniline and N,N-dimethylaniline, but it is not limited to those ammonium salts mentioned above.

The portion of $-X-(CH_2)_k-COOT$ of the carboxyl group-containing moiety, when X represents sulfur, oxygen, single bond or N—U, is preferably bonded onto an aryl ring or aromatic heterocyclic ring from the viewpoint of the sensitivity of the layer.

Preferred examples of the sensitizer moiety of the polymer according to the invention include those containing a residue or residues of aromatic ketone compounds such as xanthone, fluorenone, benzophenone, thioxanthone, 2-methylthioxanthone, 2-chlorothioxanthone, 2-isopropylthioxanthone, 2,4-diethylthioxanthone, acetophenone, naphthylacetone, 4,4'-bisdimethylaminobenzophenone, trinitrofluorenone, dibenzosuberone, 2,5-bis-(4'-diethylaminobenzal)cyclopentanone, α,α-dichloro-4-phenoxyacetophenone, 1-hydroxycyclohexylphenylketone; aromatic thioketone compounds such as 4,4'-bisdimethylaminothiobenzophenone; quinone compounds such as benzoquinone, dichlorobenzoquinone, tetrachlorobenzoquinone, dichloronaphthoquinone, anthraquinone, phenanthrenequinone, dichloroanthraquinone, dinitroanthraquinone, alizarin and benzanthraquinone; aromatic nitro compounds such as nitrobenzene, 1-nitronaphthalene, 4-nitrobiphenyl, 4-nitrotoluene, 1,3-dinitrobenzene and 2,4,6-trinitroaniline; aromatic hydrocarbons such as naphthalene, anthracene, phenanthrene, benzanthracene and benzpyrene; triarylpyrazoline such as triphenylpyrazoline; monoimidazole compounds such as tetraphenylimidazole and triphenylimidazole; xanthene compounds such as Fluoresceine, Eosine Y, Rose Bengal, Erythrosine B and Phloxine; acridine compounds such as acriflavin, riboflavin, acridine, 9-phenylacridine, N-phenylacridine, phenazine, 2,3-diphenylquinoxaline and acenaphtho-[1,2]-quinoxaline; coumarin compounds disclosed in U.S. Pat. No. 4,289,844 such as 7-N,N-diethylaminoketocoumarin, 3-benzoyl-7-diethylaminocoumarin, 3-benzoyl-7-methoxycoumarin and 3,3'-carbonyl-bis(7-diethylaminocoumarin); triphenylmethane compounds such as Thymol Blue, Bromothymol Blue and Bromocresol Green; quinazolinone compounds such as 2-methyl-3-benzenesulfonyloxy-4(3H)-quinazolinone and 2-(β-styryl-3-benzenesulfonyloxy-4(3H)-quinazolinone. The sensitizer moiety mentioned above may be used in any combination of two or more different types thereof.

The sensitizer moiety preferably shows absorption within a wave length range matching the wave length of the light source to be used.

The carboxyl group-containing moiety and the sensitizer moiety are bonded to the polymer main chain directly or via a bridging group. The bridging group may be ether bond, amide bond, ester bond, urethane bond, ureide bond or those groups containing such bonds. Further, a part of the carboxyl group-containing moiety or the sensitizer moiety may be contained in the polymer main chain.

Examples of the bridging group containing ether bond, amide bond, ester bond, urethane bond and/or ureide bond include those represented by the following general formulae II, III, IV and V:

$$-L-(-R-L-)_n-R- \quad (II)$$

$$-L-(-R-L-)_n- \quad (III)$$

$$-R-(-L-R-)_n-L- \quad (IV)$$

$$-R-(-L-R-)_n-(V) \quad (V)$$

wherein R, which may be identical or different, independently represents an alkylene, arylene, aralkylene group or a divalent heterocyclic ring; L, which may be identical or different, independently represents an ether bond, amide bond, ester bond, urethane bond or ureide bond; and n is 0, 1 or 2.

Examples of the polymer used in the present invention include acrylic resin, vinyl polymerization resin including vinyl alcohol resin, polyurethane resin, polyurea resin, polyvinyl acetal resin, polyamide resin and epoxy resin, but it is not limited to those resins mentioned above. Among those resins, the vinyl polymerization resin is particularly preferred from the viewpoint of the facility of the synthesis thereof.

The polymer having the aforementioned carboxyl group-containing moiety and the sensitizer moiety may be obtained, for example, when the polymer is a vinyl polymerization resin, by copolymerizing a monomer or monomers having the carboxyl group-containing moiety of the following general formula VI;

$$CH_2=C(E)-Z-(Y)_1-X-(CH_2)_k-COOT \quad (VI)$$

wherein E represents $CH_3$ or hydrogen atom and Z represents a bridging group such as an alkylene, arylene, aralkylene group, ether bond, amide bond, ester bond, urethane bond and a group consisting of two or more of those groups and bonds, and X, Y, T, 1 and k have the same meanings as defined in the aforementioned general formula I, with a monomer or monomers having the sensitizer moiety and polymerizable ethylenically unsaturated bond, and optionally with a monomer or monomers copolymerizable with those essential monomers, for example, acrylic acid ester and methacrylic acid ester.

The polymer according to the invention may be either of a block copolymer, random copolymer or graft copolymer.

The carboxyl group-containing moiety and the sensitizer moiety may be also introduced into the polymer by a polymer reaction of vinyl polymer.

The monomer having the sensitizer moiety and an ethylenically unsaturated bond includes those represented by the following general formula, but it is not limited in them;

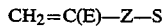
$$CH_2=C(E)-Z-S$$

wherein E and Z have the same meanings as defined in the general formula VI and S represents the sensitizer moiety.

Examples of this monomer include those exemplified below, but it is not limited to them;

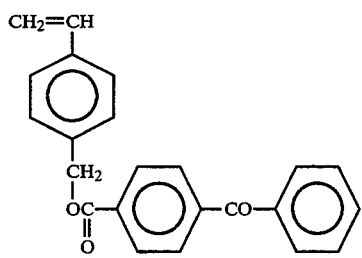 (S-1)
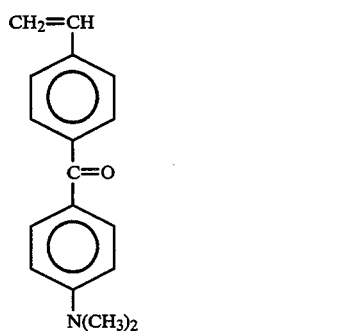 (S-2)
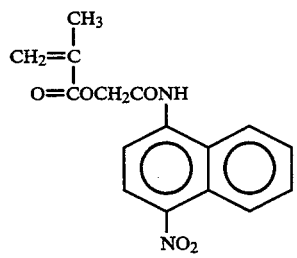 (S-3)
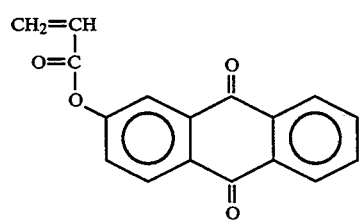 (S-4)
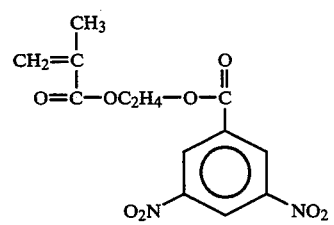 (S-5)
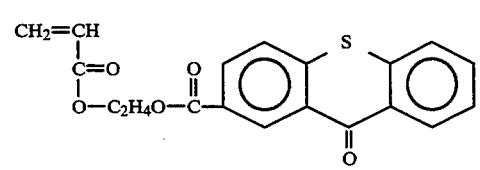 (S-6)

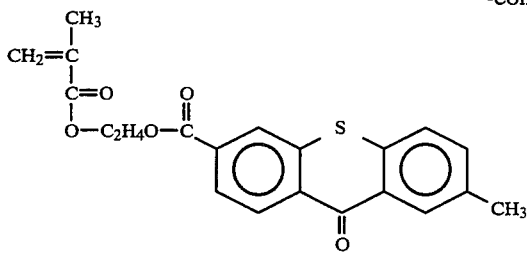

(S-7)

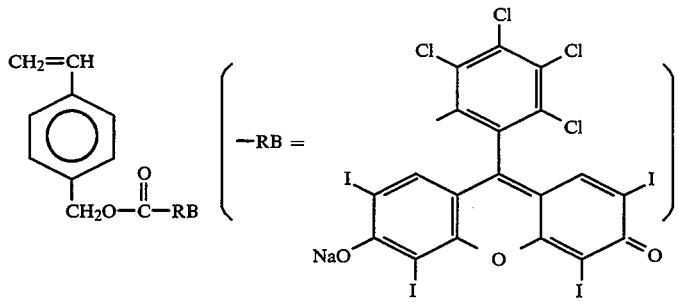

(S-8)

The monomer optionally copolymerized in the polymer according to the invention is selected from, for example, compounds having an addition polymerizable unsaturated bond including acrylic acid esters, acrylamides, methacrylic acid esters, methacrylamides, vinyl ethers, vinyl esters, styrene derivatives and crotonic acid esters. Examples of this monomer include acrylic acid esters such as alkyl acrylate, preferably $C_{1-10}$ alkyl acrylate, e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, 2-hydroxyethyl acrylate, benzyl acrylate, methoxybenzyl acrylate, furfuryl acrylate, tetrahydrofurfuryl acrylate aryl acrylate, e.g., phenyl acrylate; methacrylic acid esters such as alkyl methacrylate, preferably $C_{1-10}$ alkyl methacrylate, e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate and aryl methacrylate, e.g., phenyl methacrylate, cresyl methacrylate and naphthyl methacrylate; acrylamides such as acrylamide, N-alkylacrylamide preferably comprising a $C_{1-10}$ alkyl group, e.g., methyl, ethyl, propyl, butyl, t-butyl, heptyl, octyl, cyclohexyl, benzyl and hydroxyethyl, N-arylacrylamide comprising an aryl group such as phenyl, tolyl, nitrophenyl, naphthyl and hydroxyphenyl, N,N-dialkylacrylamide preferably comprising $C_{1-10}$ alkyl groups, e.g., methyl, ethyl, butyl, i-butyl, ethylhexyl and cyclohexyl, N,N-diarylacrylamide comprising aryl groups such as phenyl, N-methyl-N-phenylacrylamide, N-hydroxyethyl-N-methylacrylamide, N-2-acetamidoethyl-N-acetylacrylamide; methacrylamide such as methacrylamide, N-alkylmethacrylamide preferably comprising a $C_{1-10}$ alkyl group, e.g., methyl, ethyl, t-butyl, ethylhexyl, hydroxyethyl and cyclohexyl, N-arylmethacrylamide comprising an aryl group such as phenyl, N,N-dialkylmethacrylamide preferably comprising $C_{1-10}$ alkyl groups such as ethyl, propyl and butyl, N,N-diarylmethacrylamide comprising aryl groups such as phenyl, N-hydroxyethyl-N-methylmethacrylamide, N-methyl-N-phenylmethacrylamide and N-ethyl-N-phenylmethacrylamide; allyl compounds including allyl esters such as allyl caproate, allyl caprylate, allyl laurate, allyl palmitate, allyl stearate, allyl benzoate, allyl acetoacetate and allyl lactate, and allyloxyethanol; vinyl ethers including alkyl vinyl ether such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether, vinyl aryl ethers such as vinyl phenyl ether, vinyl tolyl ether, vinyl chlorophenyl ether, vinyl 2,4-dichlorophenyl ether, vinyl naphthyl ether and vinyl anthranyl ether; vinyl esters such as vinyl butyrate, vinyl isobutyrate, vinyl trimethylacetate, vinyl diethylacetal, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate and vinyl naphthoate; styrene and derivatives thereof such as styrene, alkylstyrene, e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene, alkoxystyrenes, e.g., methoxystyrene, 4-methoxy-3-methylstyrene and dimethoxystyrene, halogenostyrenes, e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene; crotonic acid esters including alkyl crotonate such as butyl crotonate, hexyl crotonate and glycerin monocrotonate; dialkyl itaconates such as dimethyl itaconate, diethyl itaconate and dibutyl itaconate; dialkyl maleates such as dimethyl maleate; dialkyl fumarates such as dibutyl fumarate; acrylonitrile, methacrylonitrile;and any combination of those monomers; however, the optionally copolymerizable monomer is not limited to the above-mentioned monomers.

When the polymer is consisted of urethane resin, it may be obtained by reacting a diol having the carboxyl group-containing moiety and represented by the following general formula VII;

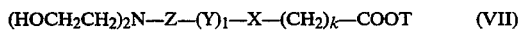

$(HOCH_2CH_2)_2N-Z-(Y)_l-X-(CH_2)_k-COOT$ (VII)

wherein X, Y, T, l and k have the same meanings as defined hereinbefore and Z represents a bridging group including a single bond, and a diol having the sensitizer moiety and represented by the following general formula VIII;

$(HOCH_2CH_2)_2N-Z-S$ (VIII)

wherein Z represents a bridging group including a single bond and S represents a sensitizer moiety, with a diisocyanate.

When the polymer is consisted of polyester resin, it may be obtained by reacting the diols of the formulae VII and VIII above with a compound having acid chloride functionals at the both terminals thereof.

The acid content of the polymer according to the invention is preferably from 6.0 meq/g to 0.01 meq/g, particularly from 3.0 meq/g to 0.1 meq/g. When the acid content is lower than 0.01 meq/g, the developability with alkaline developer is unacceptably deteriorated, whereas when it exceeds 6.0 meq/g, the coating strength and the adhesion to the substrate are unacceptably lowered. The polymer may additionally contain carboxyl residues which cannot be decarbonated by light exposure. Further, two or more different types of the carboxyl group-containing moiety which can be decarbonated by light exposure may be contained in a single molecule of the polymer.

The weight average molecular weight of the polymer according to the present invention, determined by the gel permeation chromatography, is preferably from 2,000 to 1,000,000, particularly from 8,000 to 200,000. When it is lower than the above-specified range, the scratch resistance of the image portions is unacceptably deteriorated, while the developability is deteriorated when it exceeds the range.

It is possible to use the polymer in a combination of two or more different types of the polymer.

Further, it is also possible to use the polymer mixed with other polymers which do not have the carboxyl group-containing moiety and/or the sensitizer moiety. In this case, such optional polymer should constitute less than 95 weight % of the whole image forming layer, since the intended advantage of the present invention cannot be obtained when the weight ratio of the optional polymer exceeds the above-identified upper limit. Examples of the optional polymer which may be contained in the image forming layer according to the invention include polyamide resin, epoxy resin, polyurethane resin, acryl resin, polyester resin, polyvinyl acetal resin and the like.

The molar ratio of the carboxyl group-containing moiety to the sensitizer moiety in the polymer used in the present invention is preferably not less than 0.1, particularly not less than 0.5.

When the polymer is a vinyl polymerization resin, it preferably comprises 0.5 to 95 mole % of the carboxyl group-containing monomer and 0.5 to 50 mole % of the monomer containing the sensitizer moiety.

The image forming layer according to the present invention may contain a diazonium compound. Examples of the diazonium compound are those disclosed in U.S. Pat. Nos. 3,867,147 and 2,632,703 and particularly preferred are diazo resins such as a condensate of an aromatic diazonium salt and an active carbonyl group-containing compound such as formaldehyde. Preferred examples of the diazo resin are hexafluorophosphate, tetrafluorophosphate and phosphate of a condensate of p-diazodiphenylamine and formaldehyde or acetaldehyde. In addition, the preferred examples further include sulfonates such as p-toluenesulfonate and 2-methoxy-4-hydroxy-5-benzoylbenzenesulfonate, phosphinates such as benzenephosphinate, salts with hydroxyl group-containing organic compounds such as salt with 2,4-dihydroxybenzophenone and organic carboxylates of a condensate of p-diazodiphenylamine and formaldehyde as disclosed in U.S. Pat. No. 3,300,309. Moreover, those obtained by condensing 3-methoxy-4-diazodiphenylamine with 4,4'-bis-methoxymethyldiphenyl ether and then converted to a mesitylenesulfonate salt as disclosed in JP (KOKAI) No. 58-27141 are also suitable. Further, also preferred are the diazonium salt compounds having an alkali soluble group disclosed in JP (KOKAI) Nos. 1-102457, 1-254949, 2-66, 2-29650 and 1-245246.

Those diazonium compounds may be added to the image layer in an amount of from 0.1 to 50 % by weight, preferably 3 to 15% by weight of the whole image forming layer. When the amount is lower than 1% by weight, the affinity to the substrate is not satisfactorily improved, whereas the amount exceeds 50 % by weight, the properties of the coating is deteriorated.

The image forming layer according to the present invention may further contain a dye compound. Preferred examples of the dye compound include oil-soluble dyes such as C.I. 26105 (Oil Red RR), C.I. 21260 (Oil Scarlet #308), C.I. 74350 (Oil Blue), C.I. 52015 (Methylene Blue), C.I. 42555 (Crystal Violet) and C.I. 42595 (Victoria Pure Blue).

Those dyes may be preferably added into the image forming layer of the invention in an amount of 0.01 to 20.0 % by weight of the whole image forming layer.

The image forming layer according to the invention may also contain the low molecular sensitizers disclosed in JP (KOKAI) No. 64-32255.

The image forming layer according to the invention may also contain a polymerizable compound having an ethylenically unsaturated bond, i.e., a compound having at least one ethylenically unsaturated bond in the chemical structure of the molecule thereof, which includes monomer and prepolymer, i.e., oligomer such as dimer, trimer and other oligomer, a mixture thereof and a copolymer thereof. Examples of such compound include unsaturated carboxylic acids and salts thereof, esters of unsaturated carboxylic acids and polyfunctional aliphatic alcohol compounds, amides of unsaturated carboxylic acid and aliphatic polyamine compounds and the like.

Examples of the unsaturated carboxylic acid include acrylic acid, methacrylic acid, itaconic acid, crotonic acid, isocrotonic acid and maleic acid.

Examples of the salt of the unsaturated carboxylic acid include alkali metal salts such as sodium salt and potassium salt of the aforementioned acid.

Examples of the ester of the polyfunctional aliphatic alcohol compound and the unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerithritol diacrylate, pentaerithritol triacrylate, pentaerithritol tetraacrylate, dipentaerithritol diacrylate, dipentaerithritol triacrylate, dipentaerithritol tetraacrylate, dipentaerithritol hexaacrylate, sorbitol triacrylate, sorbitol tetraacrylate, sorbitol pentaacrylate, sorbitol hexaacrylate, polyester acrylate oligomer; methacrylic acid esters such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerithritol dimethacrylate, pentaerithritol trimethacrylate, dipentaerithritol dimethacrylate, sorbitol trimethacrylate, sorbitol tetramethacrylate, bis-(3-p-(methacryloxy-2-hydroxypropoxy)phenyl)dimethylmethane, bis-(p-(methacryloxyethoxy)phenyl)dimethylmethane and the like; itaconic acid esters such as ethylene glycol diitaconate, propylene glycol diitaconate, 1,3-butanediol diitaconate, 1,4-butanediol diitaconate, tetramethylene glycol diitaconate, pentaerithritol diitaconate, sorbitol tetraitaconate and the like; crotonic acid esters such as ethylene glycol dicrotonate, tetramethylene glycol dicrotonate, pentaerithritol dicrotonate, sorbitol tetracrotonate and the like; isocrotonic acid esters such as ethylene glycol diisocrotonate, pentaerithritol diisocrotonate, sorbitol tetraisocrotonate and the like, maleic acid esters such as ethylene glycol dimaleate, triethylene glycol dimaleate, pentaerithritol dimaleate, sorbitol tetramaleate and the like; and mixtures of aforementioned esters.

Examples of the amide of the aliphatic polyamine and the unsaturated carboxylic acid include methylenebis-acrylamide, methylenebis-methacrylamide, 1,6-hexamethylenebis-acrylamide, 1,6-hexamethylenebis-methacrylamide and the like.

The polymerizable compound having an ethylenycally unsaturated bond encompasses the vinyl urethane compounds having two or more polymerizable vinyl groups in the single molecule thereof, which are disclosed in JP (KOKAI) No. 48-41708 and obtained by reacting a polyisocyanate compound having two or more isocyanate groups in the single molecule thereof with a vinyl monomer represented by the following general formula IX;

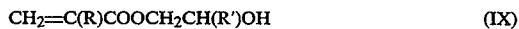

$$CH_2=C(R)COOCH_2CH(R')OH \qquad (IX)$$

wherein R and R' independently represent H or $CH_3$.

Those polymerizable compounds having one or more ethylenycally unsaturated bonds may be preferably added into the image forming layer of the present invention in an amount of 1 to 80 weight %, particularly 5 to 60 % by weight of the whole image forming layer.

The light-sensitive composition according to the invention may contain, other than the components mentioned above, a pigment, stabilizer, filler, surfactant, plastisizer or the like to improve the properties of the composition, if necessary.

The image forming layer of the present invention is formed by dissolving the light-sensitive composition in a solvent, applying the dissolved composition on a suitable substrate and drying it. The application amount is preferably from 0.01 to 500 $g/m^2$, particularly from 0.1 to 200 $g/m^2$ in dry weight.

Examples of the solvent for dissolving the composition include methanol, ethanol, isopropanol, n-butanol, t-butanol, 2-methoxyethanol, 2-ethoxyethanol, 2-methoxyethyl acetate, ethylene glycol, tetrahydrofuran, dioxane, dimethylsulfoxide, N,N-dimethylformamide, acetone, methyl ethyl ketone, 1-methoxy-2-propanol, 2-methoxy-1-propanol, 1-methoxy-2-acetoxypropane, 2-methoxy-1-acetoxypropane, ethyl acetate, methyl acetate, toluene, xylene and a mixture of those solvent.

Examples of the substrate to which the image forming layer of the invention is applied include paper; paper laminated with a plastic sheet such as a sheet of polyethylene, polypropylene or polystyrene; metal plates such as aluminum (inclusive of aluminum alloys), zinc and copper plates; films of plastics such as scellulose diacetate, cellulose triacetate, cellulose propionate, cellulose butyrate, cellulose acetate butyrate, nitocellulose, polyethylene terephthalate, polyethylene, polystyrene, polypropylene, polycarbonate and polyvinyl acetal; and paper or plastic films which are laminated with a foil of the foregoing metals or to which a layer of such a metal is deposited. Among these, an aluminum plate is particularly preferred because of its high dimentional stability and low cost. In addition, composite sheets comprising polyethylene terephthalate to which an aluminum sheet is coated as disclosed in JP-B (KOKOKU) No. 48-18327 are also preferred.

If the substrate has a metal surface, in particular an aluminum surface, it is desirable to subject it to a surface treatment, for example, an electrolytic graining treatment, combined graining treatment, graining treatment, immersion treatment into a solution of sodium silicate, potassium fluorozirconate, phosphates or the like, anodization treatment and the like. Preferred examples of the anodization treatment include the anodization in sulfuric acid with a high current density as disclosed in BP No. 1,412,768, the anodization in a phosphoric acid electrolytic bath as disclosed in U.S. Pat. No. 3,511,661 and the anodization in a mixed acid of phosphoric acid and sulfuric acid as disclosed in JP-B No. 46-43124, JP-A Nos. 52-103208 and 55-28400. Also preferred plated are an aluminum plate treated by immersing it into an aqueous solution of sodium silicate after the graining and the aluminum plate treated by immersing it into an aqueous solution of alkali metal silicate after the anodization as disclosed in JP-B No. 47-5125. The anodization treatments mentioned above are carried out by an electrolysis in an electrolyte comprising one or more of aqueous or non-aqueous solutions of a inorganic acid such as phosphoric acid, chromic acid, sulfuric acid, boric acid and the like or an organic acid such as oxalic acid, sulfamic acid and the like, salts thereof or a mixture thereof using the aluminium plate to be anodized as the anode.

Also preferred are those subjected to a sealing treatment after the graining treatment and the anodization. Such sealing treatment is carried out by immersing the plate into an aqueous solution of sodium silicate or polyvinylphosphonic acid, hot water, hot aqueous solution of an inorganic or organic salt or by steaming treatment.

The silicate electrodeposition disclosed in U.S. Pat. No. 3,658,662 may be also effectively used as the surface treatment.

The image forming layer of the present invention applied to the surface of the substrate is imagewise exposed to light through an original transparency carrying line or half-tone dot images and then developed with an aqueous developer to provide relief images negative with respect to the original.

As a light source used in the exposure, there may be named, for instance, a carbon arc lamp, a mercury lamp, a xenon lamp, tungsten lamp, metal halide lamp and argon laser; however, it is not limited to those mentioned above.

Any known developer may be used for the development of the image forming layer according to the invention, but preferred are as follows.

Desirable developers comprise at least one alkaline agent and water as essential components.

Examples of the alkaline agent are inorganic alkaline agents such as sodium silicate, potassium silicate, potassium hydroxide, sodium hydroxide, lithium hydroxide, sodium secondary phosphate, sodium tertiary phosphate, ammonium secondary phosphate, ammonium tertiary phosphate, sodium metasilicate, sodium carbonate, and aqueous ammonia; organic alkaline agents of amine compounds such as mono-, di- and trimethylamines, mono-, di- and triethylamines, mono-, di and triisopropylamines, n-butylamine, mono-, di and triethanolamines, mono-, di- and triisopropanolamines, ethyleneimine and ethylenediimine.

These alkaline agents are used in the developer in an amount of from 0.05 to 10 % by weight, preferably 0.5 to 5 % by weight. If the amount is less than 0.05 % by weight, the development is incomplete, whereas if it exceeds 10 % by weight, the images are likely to suffer scratches upon development.

The developer for developing the image forming layer of the present invention may optionally comprise specific organic solvents.

The organic solvents are preferably those capable of solubilizing or swelling the non-exposed areas (non-image areas) of the light-sensitive layer during the development and having a solubility in water of not more than 10 % by weight at room temperature (about 20° C.). Examples of such organic solvent are carboxylic acid esters such as ethyl acetate, propyl acetate, butyl acetate, amyl acetate, benzyl acetate, ethylene glycol monobutyl acetate, butyl lactate, and butyl levulinate; ketones such as ethyl butyl ketone, methyl isobutyl ketone and cyclohexanone; alcohols such as ethylene glycol monobutyl ether, ethylene glycol benzyl ether, ethylene glycol monophenyl ether, benzyl alcohol, methyl phenyl carbinol, n-amyl alcohol and methylamyl alcohol; alkyl-substituted aromatic hydrocarbons such as xylene; and halogenated hydrocarbons such as methylene dichloride, ethylene dichloride and monochlorobenzene. Those organic solvents may be used alone or in any combination thereof. Among those solvents, particularly preferred are ethylene glycol monophenyl ether and benzyl alcohol. The organic solvents may be used in an amount of from 0 to 20 % by weight, preferably 2 to 10 % by weight of the developer to obtain a good result.

The developer may comprise water-soluble sulfites, preferably water-soluble sulfites of alkali or alkaline earth metals such as sodium, potassium, lithium and magnesium. The amount of the sulfite is 0 to 4 % by weight, preferably 0.1 to 1 by weight of the developer.

It is also possible to use alkaline-soluble pyrazolone compounds, alkaline-soluble thiol compounds, hydroxyl group-containing aromatic compounds such as methyl resorcin in place of or in combination with the aforementioned water-soluble sulfite.

Moreover, to promote the dissolution of the foregoing organic solvent in water, specific solubilizing agents may be incorporated into the developer. The solubilizing agents are preferably those having a higher solubility in water and a lower molecular weight than those of the aforementioned organic solvents, for example, lower alcohols and ketones. Besides, anionic and amphoteric surfactants may also be used.

Preferred examples of such alcohols and ketones are methanol, ethanol, propanol, butanol, acetone, methyl ethyl ketone, ethylene glycol monomethyl ether, ethylene glycol monoethyl ether, methoxybutanol, ethoxybutanol, 4-methoxy-4-methylbutanol and N-methylpyrrolidone. Preferred examples of the surfactant are sodium isopropylnaphthalenesulfonate, sodium n-butylnaphthalenesulfonate, sodium N-methyl-N-pentadecylaminoacetate and sodium laurylsulfate. The amount of the solubilizing agent such as the alcohols and ketones is preferably not more than 30% by weight of the total weight of the developer.

The image forming layer according to the invention is mainly used as a material for printing plate and resist.

The image forming layer according to the invention shows an extremely high sensitivity and excellent scratch resistance of the image areas upon development.

EXAMPLES

The present invention will be further illustrated hereafter by means of the following specific examples, but it is not limited thereto. The term "%" in the examples means "% by weight unless otherwise specified".

Preparation of Polymer

The component monomers shown in Table 1 were dissolved in tetrahydrofuran (THF) in a ratio of 1 mol of the monomers to 300 ml of THF and heated up to 65° C. under a nitrogen flow. Then, the monomer solution was added with azobisisobutyronitrile in a ratio of 1 g of azobisisobytyrinitrile to 1 mol of the monomers and stirred. After stirring for 10 hours, the polymerization liquor was poured into 10 l of water to deposit polymer. The deposited polymer was taken by filtration and dried.

TABLE 1

| Polymer No. | Monomer (molar ratio) | | | | Molecular Weight | Acid Content (meq/g) |
| --- | --- | --- | --- | --- | --- | --- |
| | I | II | III | IV | | |
| 1 | A (50) | S-6 (50) | | | 5000 | 1.62 |
| 2 | A (10) | S-6 (10) | P (80) | | 50000 | 0.70 |
| 3 | A (5) | S-6 (5) | Q (50) | T (40) | 120000 | 0.37 |
| 4 | A (10) | S-4 (5) | R (30) | W (55) | 12000 | 0.76 |
| 5 | A (40) | S-4 (50) | S (10) | | 30000 | 1.60 |
| 6 | A (30) | S-2 (30) | T (40) | | 80000 | 1.48 |
| 7 | A (40) | S-2 (20) | Q (40) | | 10000 | 2.10 |
| 8 | B (50) | S-6 (50) | | | 8000 | 1.70 |
| 9 | B (30) | S-5 (10) | Q (60) | | 3000 | 1.78 |
| 10 | C (50) | S-6 (50) | | | 7000 | 1.44 |
| 11 | C (20) | S-4 (40) | U (40) | | 30000 | 0.90 |
| 12 | C (50) | S-4 (20) | V (30) | | 110000 | 1.91 |
| 13 | C (5) | S-2 (5) | V (40) | R (50) | 50000 | 1.53 |
| 14 | C (5) | | V (45) | R (50) | 250000 | 0.51 |
| 15 | A (50) | | Q (50) | | 40000 | 2.84 |

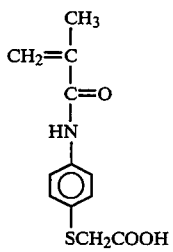

A

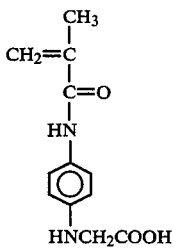

B

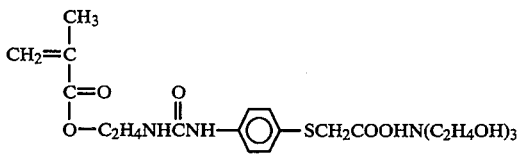

C

Monomer II: Monomer having sensitizer moiety
The symbols used in Table 1 correspond to those used in Pages 9 to 10 hereinbefore.
Monomers III and IV:
P Methyl methacrylate
Q Ethyl methacrylate
R Acrylonitrile
S Acrylic acid
T 2-Hydroxyethyl methacrylate
U Ethyl acrylate
V 2-Hydroxyethyl acrylate
W Butyl methacrylate Examples 1 to 13

Each light-sensitive solution having the following composition was prepared, then coated on a polyethylene terephthalate sheet having a thickness of 25 μm by means of a rod coater and dried in an oven at 80° C. for 2 minutes to form an image forming layer having a dry thickness of 10 μm.

| Light-sensitive solution | |
|---|---|
| 25% Solution of Polymer No. 1 to 13 in THF | 2 g |
| 2-Methoxyethanol | 5 g |

Each image forming layer thus obtained was imagewise exposed to light from PS light (Fuji Photo Film Co., Ltd) at a distance of 1 m therefrom through a step wedge (Fuji Photo Film Co., Ltd) for 5 minutes and immersed in a developer having the following composition at room temperature for one minute, followed by rubbing the surface thereof with absorbent cotton lightly to remove the unexposed areas so as to obtain a light yellow image.

| Developer | |
|---|---|
| Sodium carbonate | 5 g |
| 2-Methoxyethanol | 5 g |
| Sodium dodecylbenzenesulfonate | 10 g |
| Water | 1000 g |

The results are shown in Table 2 below.

Comparative Examples 1 and 2

The procedures of Examples 1 to 13 were repeated except that the following light-sensitive solutions were employed to obtain light yellow images.

| Light-sensitive solution | |
|---|---|
| 25% Solution of Polymer No. 1 to 13 in THF | 2 g |
| Phenazine | 0.1 g |
| 2-Methoxyethanol | 5 g |

The results of those Comparative Examples are also shown in Table 2.

TABLE 2

| Polymer No. | Solid Sensitivity (step) | Scratch Resistance upon Development |
|---|---|---|
| Example No. | | |
| 1 | 1 | 1 | Good |
| 2 | 2 | 3 | Good |
| 3 | 3 | 6 | Excellent |
| 4 | 4 | 5 | Excellent |
| 5 | 5 | 2 | Good |
| 6 | 6 | 1 | Good |
| 7 | 7 | 1 | Good |
| 8 | 8 | 1 | Good |
| 9 | 9 | 2 | Excellent |
| 10 | 10 | 1 | Good |
| 11 | 11 | 3 | Good |
| 12 | 12 | 5 | Excellent |
| 13 | 13 | 6 | Excellent |
| Comparative Example No. | | |
| 1 | 14 | Not more than 1 | Bad |
| 2 | 15 | Not more than 1 | Bad |

As seen from the results shown in Table 2, the image forming layers of the present invention show higher sensitivity and more excellent scratch resistance upon development as compared with the comparative image forming layers.

Examples 14 to 26

The surface of an aluminum plate having a thickness of 0.24 mm was grained using a nylon brush and an aqueous suspension of 400 mesh pumice stone and thereafter sufficiently washed with water. The plate was immersed in 10 % sodium hydroxide aqueous solution at 70° C. for 60 second to etch the plate, followed by washing it with running water, neutralizing and washing with 20 % nitric acid solution and then electrolytically graining the plate by the electrochemical graining method as disclosed in JP-A No. 53-67507, i.e., electrolytically graining the plate in 1% aqueous sulfuric acid solution utilizing an alternating sine waved current of $V_A = 12.7$ V and $V_c = 9.1$ V so that the quantity of electricity at the anode time was 160 coulomb/dm². Subsequently, the aluminum plate was immersed in 30% aqueous sulfuric acid solution at 55° C. for two minutes to desmut the plate and was anodized in 7 % aqueous sulfuric acid solution until the thickness of the resultant aluminum oxide layer was 2.0 g/m². Thereafter, the plate was immersed in 3% aqueous sodium silicate solution maintained at 70° C. for one minute, then washed with water and dried.

Each light-sensitive solution having the following composition was applied on the above-obtained plate by means of a whirler and dried at 80° C. for 2 minutes. The coated amount was 2.0 g/m² in dry weight.

| Light-sensitive solution | |
|---|---|
| 25% Solution of Polymer No. 1 to 13 in THF | 2 g |
| Victoria Pure Blue BOH | 0.018 g |
| 2-Methoxyethanol | 8.5 g |

Each image forming layer thus obtained was image-wise exposed to light from PS light (Fuji Photo Film Co., Ltd) at a distance of 1 m therefrom through a step wedge (Fuji Photo Film Co., Ltd) for 10 minutes and immersed in a developer having the following composition at room temperature for one minute, followed by rubbing the surface thereof with absorbent cotton lightly to remove the unexposed areas so as to obtain a light blue image.

| Developer | |
|---|---|
| Sodium sulfite | 5 g |
| Benzyl alcohol | 30 g |
| Sodium carbonate | 5 g |
| Sodium isopropylnaphthalenesulfonate | 12 g |
| Water | 1000 g |

The results are shown in Table 3 below.

Comparative Examples 3 and 4

The procedures of Examples 14 to 26 were repealed except that the following light-sensitive solutions were employed to obtain printing plates having a light blue image.

| Light-sensitive solution | |
|---|---|
| 25% Solution of Polymer No. 14 or 15 in THF | 2 g |
| Victoria Pure Blue BOH | 0.018 g |
| Phenazine | 0.2 g |
| 2-Methoxyethanol | 8.5 g |

The results of those Comparative Examples are also shown in Table 3.

TABLE 3

| Polymer No. | Solid Sensitivity (step) | Scratch Resistance upon Development |
|---|---|---|
| Example No. | | |
| 14 | 1 | 1 | Good |
| 15 | 2 | 4 | Good |
| 16 | 3 | 8 | Excellent |
| 17 | 4 | 7 | Excellent |
| 18 | 5 | 2 | Good |
| 19 | 6 | 3 | Good |
| 20 | 7 | 2 | Good |
| 21 | 8 | 1 | Good |
| 22 | 9 | 3 | Excellent |
| 23 | 10 | 2 | Excellent |
| 24 | 11 | 2 | Good |
| 25 | 12 | 4 | Excellent |
| 26 | 13 | 7 | Excellent |

TABLE 3-continued

| Polymer No. | Solid Sensitivity (step) | Scratch Resistance upon Development |
|---|---|---|
| Comparative Example No. | | |
| 3 | 14 | Not more than 1 | Bad |
| 4 | 15 | Not more than 1 | Bad |

As seen from the results shown in Table 3, the image forming layers of the present invention show higher sensitivity and more excellent scratch resistance upon development as compared with the comparative image forming layers.

Examples 27 to 39

The surface of an aluminum plate having a thickness of 0.24 mm was grained using a nylon brush and an aqueous suspension of 400 mesh pumice stone and thereafter sufficiently washed with water. The plate was immersed in 10 % sodium hydride aqueous solution at 70° C. for 60 second to etch the plate, followed by washing it with running water, neutralizing and washing with 20 % nitric acid solution and then electrolytically graining the plate by the electrochemical graining method as disclosed in JP-A No. 53-67507, i.e., electrolytically graining the plate in 1% aqueous sulfuric acid solution utilizing an alternating sine waved current of $V_A = 12.7$ V and $V_c = 9.1$ V so that the quantity of electricity at the anode time was 160 coulomb/dm². Subsequently, the aluminum plate was immersed in 30% aqueous sulfuric acid solution at 55° C. for two minutes to desmut the plate and was anodized in 7% aqueous sulfuric acid solution until the thickness of the resultant aluminum oxide layer was 2.0 g/m². Thereafter, the plate was immersed in 3% aqueous sodium silicate solution maintained at 70° C. for one minute, then washed with water and dried.

Each light-sensitive solution having the following composition was applied on the above-obtained plate by means of a whirler and dried at 80° C. for 2 minutes. The coated amount was 2.0 g/m² in dry weight.

| Light-sensitive solution | |
|---|---|
| 25% Solution of Polymer No. 1 to 13 in THF | 2 g |
| Victoria Pure Blue BOH | 0.018 g |
| Tetrahydrofuran | 10 g |
| PF₆ salt of condensate of 4-diazodiphenyl-amine and formalin | 0.05 g |

Each image forming layer thus obtained was image-wise exposed to light from PS light (Fuji Photo Film Co., Ltd) at a distance of 1 m therefrom through a step wedge (Fuji Photo Film Co., Ltd) for 5 minutes and immersed in a developer having the following composition at room temperature for one minute, followed by rubbing the surface thereof with absorbent cotton lightly to remove the unexposed areas so as to obtain a light blue image.

| Developer | |
|---|---|
| Sodium sulfite | 5 g |
| Benzyl alcohol | 30 g |
| Sodium carbonate | 5 g |
| Sodium isopropylnaphthalenesulfonate | 12 g |

| | Developer | |
|---|---|---|
| | Water | 1000 g |

The results are shown in Table 4 below.

Comparative Examples 5 and 6

The procedures of Examples 27 to 39 were repeated except that the following light-sensitive solutions containing the polymer No. 14 or 15 were employed to obtain printing plates having a light blue image.

| Light-sensitive solution | |
|---|---|
| 25% Solution of Polymer No. 14 or 15 in THF | 2 g |
| Victoria Pure Blue BOH | 0.018 g |
| Phenazine | 0.2 g |
| PF$_6$ salt of condensate of 4-diazodiphenylamine and formalin | 0.05 g |
| Tetrahydrofuran | 10 g |

The results of those Comparative Examples are also shown in Table 4.

TABLE 4

| | Polymer No. | Solid Sensitivity (step) | Scratch Resistance upon Development |
|---|---|---|---|
| Example No. | | | |
| 27 | 1 | 2 | Excellent |
| 28 | 2 | 4 | Excellent |
| 29 | 3 | 8 | Excellent |
| 30 | 4 | 6 | Excellent |
| 31 | 5 | 2 | Excellent |
| 32 | 6 | 3 | Excellent |
| 33 | 7 | 2 | Excellent |
| 34 | 8 | 1 | Excellent |
| 35 | 9 | 4 | Excellent |
| 36 | 10 | 3 | Excellent |
| 37 | 11 | 3 | Excellent |
| 38 | 12 | 4 | Excellent |
| 39 | 13 | 7 | Excellent |
| Comparative Example No. | | | |
| 5 | 14 | 1 | Slightly bad |
| 6 | 15 | 1 | Slightly bad |

As seen from the results shown in Table 4, the image forming layers of the present invention show higher sensitivity and more excellent scratch resistance upon development as compared with the comparative image forming layers.

Examples 40 to 52

Light-sensitive compositions having the following compositions were prepared, then applied on polyethylene terephthalate films having a thickness of 25 μm by means of a rod coater so as to obtain a dry thickness of 50 μm and dried in an oven at 100° C. for 5 minutes.

| Light-sensitive solution | |
|---|---|
| 25% Solution of Polymer No. 1 to 13 in THF | 60 g |
| 2,4-Dimethylthioxanthone | 0.3 g |
| Ethyl p-dimethylaminobenzoate | 0.33 g |
| Tribromomethylphenyl sulphone | 0.4 g |
| Trimethylolpropane triacrylate | 3.0 g |
| Trimethylolpropane diacrylate | 5.0 g |
| Tetraethylene glycol diacrylate | 2.0 g |
| Leucomethyl Violet | 0.08 g |

| Light-sensitive solution | |
|---|---|
| 1-Phenyl-3-morpholinomethyl-1,3,4-triazole-2-thione | 0.09 g |
| Victoria Pure Blue BOH | 0.01 g |
| Methyl cellosolve | 10 g |

On the smoothened and dried copper surface of a copper-clad laminate, the light-sensitive solution was coated by means of a laminater Type A-24 (Du Pont) at 120° C. The image forming layer thus formed was exposed to light from Jet Light (2 kW ultra high pressure mercury lamp, Oak Co., Ltd.) through a wiring pattern of a high contrast transparency where transparent areas of conductive pattern (line width: 100 μm) were formed on the opaque background. After peeling off the polyethylene terephthalate film, the unexposed areas were removed by spraying 1% aqueous solution of sodium carbonate to the surface at 40° C. with a pressure of 1.5 kg/cm$^2$ for 60 seconds. The obtained resist images were evaluated.

The results are shown in Table 5.

Comparative Examples 7 and 8

The procedures of Examples 40 to 52 were repeated except that the following light-sensitive solution containing Polymer No. 14 or 15 to obtain resist images.

| Light-sensitive solution | |
|---|---|
| 25% Solution of Polymer No. 14 or 15 in THF | 60 g |
| 2,4-Dimethylthioxanthone | 0.3 g |
| Ethyl p-dimethylaminobenzoate | 0.33 g |
| Tribromomethylphenyl sulphone | 0.4 g |
| Trimethylolpropane triacrylate | 3.0 g |
| Trimethylolpropane diacrylate | 5.0 g |
| Tetraethylene glycol diacrylate | 2.0 g |
| Leucomethyl Violet | 0.08 g |
| 1-phenyl-3-morpholinomethyl-1,3,4-triazole-2-thione | 0.09 g |
| Victoria Pure Blue BOH | 0.01 g |
| Phenazine | 6 g |
| Methyl cellosolve | 10 g |

The results of those Comparative Examples are also shown in Table 5.

TABLE 5

| | Polymer No. | Quality of Resist Image |
|---|---|---|
| Example No. | | |
| 40 | 1 | Excellent |
| 41 | 2 | Good |
| 42 | 3 | Good |
| 43 | 4 | Excellent |
| 44 | 5 | Excellent |
| 45 | 6 | Good |
| 46 | 7 | Good |
| 47 | 8 | Excellent |
| 48 | 9 | Good |
| 49 | 10 | Excellent |
| 50 | 11 | Excellent |
| 51 | 12 | Good |
| 52 | 13 | Good |
| Comparative Example No. | | |
| 7 | 14 | Fairly bad |
| 8 | 15 | Fairly bad |

As seen from the results shown in Table 5, the quality of the resist images obtained with the image forming layer of the present invention is more excellent than that obtained in Comparative Examples.

Examples 53 to 65

Light-sensitive solutions of the following composition comprising each of Polymers Nos. 1 to 13 were filtered through a microfilter of 0.2 μm to prepare photoresist compositions. Each photoresist composition was applied to a silicon wafer and dried in a convection oven at 90° C. for 30 minutes to obtain a resist film of a thickness of 1.5 μm. The resist film was exposed by means of a reduced projection exposure device, then developed with the following developer, rinsed with water for 30 seconds and dried.

| Light-sensitive solution | |
| --- | --- |
| Polymer No. 1 to 13 | 5 g |
| Ethyl lactate | 15 g |
| Developer | |
| Benzyl alcohol | 15 g |
| Sodium carbonate | 5 g |
| Sodium isopropylnaphthalenesulfonate | 12 g |
| Water | 1000 g |

All of the resist images were obtained with excellent quality.

Comparative Examples 9 and 10

The procedures of Examples 53 to 65 were repeated except that the following light-sensitive solution containing Polymer No. 14 or 15 to obtain resist images.

| Light-sensitive solution | |
| --- | --- |
| Polymer No. 14 or 15 | 5 g |
| Phenazine | 0.1 g |
| Ethyl lactate | 15 g |

The qualities of the obtained images were bad.
What is claimed is:

1. An image forming layer which comprises a polymer capable of being decarboxylated by exposure to light, said polymer being a copolymer of at least one carboxyl group-containing monomer represented by the following general formula (VI):

$$CH_2=C(E)-Z-(Y)_l-X-(CH_2)_k-COOT \qquad (VI)$$

wherein E represents $CH_3$ or hydrogen atom, Z represents a bridging group consisting of at least one bond selected from an alkylene bond, an arylene bond, an ether bond, an amide bond, an ester bond or an urethane bond, X represents sulfur atom, oxygen atom or N—R where R represents a hydrogen atom, phenyl or $C_1$ to $C_{10}$ alkyl group, Y represents an alkylene group, an arylene group, an aralkylene group or a divalent heterocyclic ring, and T represents a hydrogen atom, an alkali metal, an alkaline earth metal or $HN(R^1)(R^2)(R^3)$ where $R^1$, $R^2$ and $R^3$ independently represent a hydrogen atom, an alkyl group or an aryl group or $R^1$, $R^2$ and $R^3$ can join together to form a ring, k represents 0 or 1 and l represents 0 or 1; with at least one sensitizer moiety-containing monomer represented by the following general formula:

$$CH_2=C(E)-Z-S$$

wherein E and Z have the same meanings defined in the general formula (VI) and S represents a sensitizer moiety which absorbs an ultraviolet ray of 320 nm or higher.

2. The image forming layer according to claim 1, wherein Y represents an arylene group.

3. The image forming layer according to claim 1, wherein the sensitizer moiety is selected from the group of an aromatic ketone, aromatic thioketone, aromatic nitro compound, aromatic hydrocarbons, triarylpyrazoline, xanthene compound, cumarin compound, triphenylmethane compound and quinazolinone compound.

4. The image forming layer according to claim 1, wherein said polymer has an acid content in a range of from 6.0 meq/g to 0.01 meg/g.

5. The image forming layer according to claim 1, wherein said polymer has a weight average molecular weight, determined by the gel permeation chromatography, ranging from 2,000 to 1,000,000.

6. The image forming layer according to claim 1, wherein the polymer constitutes not less than 95% by weight of the whole image forming layer.

7. The image forming layer according to claim 1, wherein the molar ratio of the carboxyl group-containing monomer to the sensitizer moiety-containing monomer in the polymer is not less than 0.1.

8. The image forming layer according to claim 7, wherein said ratio is not less than 0.5.

9. The image forming layer according to claim 1, which contains a diazonium compound in an amount of from 0.1 to 50% by weight of the whole image forming layer.

10. The image forming layer according to claim 9 wherein the diazonium compound is present in an amount of from 3 to 15% by weight of the whole image forming layer.

11. The image forming layer according to claim 1, which contains a dye compound.

12. The image forming layer according to claim 1, which contains a polymerizable compound having an ethylenically unsaturated bond in an amount of 1 to 80% by weight of the whole image forming layer.

13. The image forming layer according to claim 12 wherein the polymerizable compound having an ethylenically unsaturated bond is present in an amount of about 5 to 60% by weight of the whole image forming layer.

14. The image forming layer according to claim 1, wherein said polymer has a weight average molecular weight ranging from 8,000 to 200,000 determined by gel permeation chromatography.

15. The image forming layer according to claim 1, wherein said polymer has an acid content in a range of from 3.0 meg/g to 0.1 meq/g.

16. The image forming layer according to claim 1, wherein said carboxyl group-containing monomer is

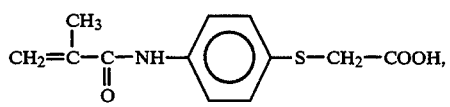

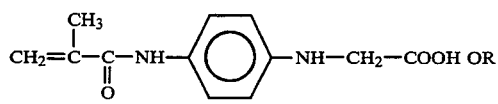
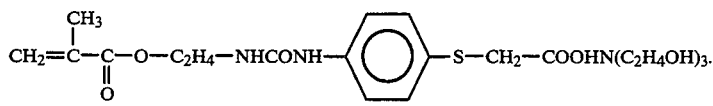
17. The image forming layer according to claim 1, wherein said sensitizer moiety-containing monomer is
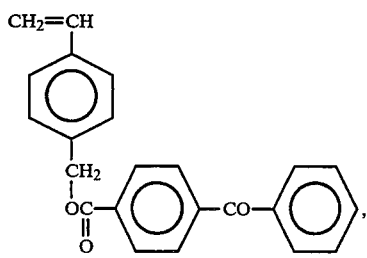
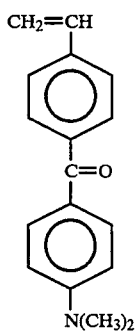
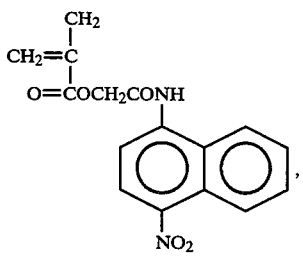
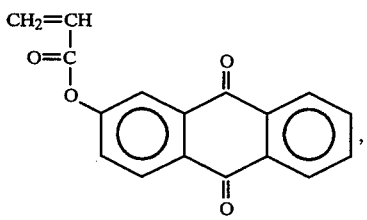
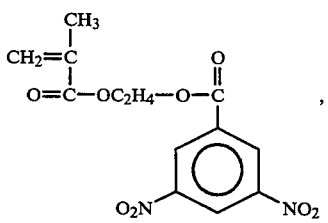

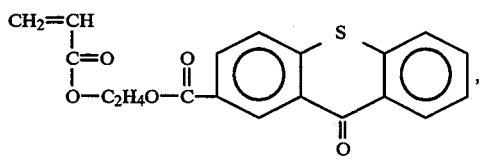

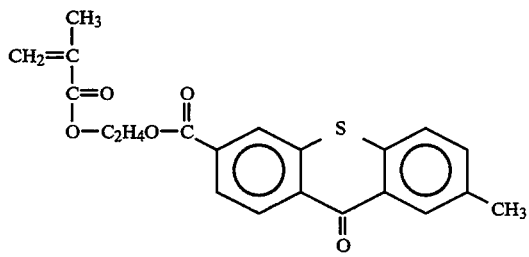

OR

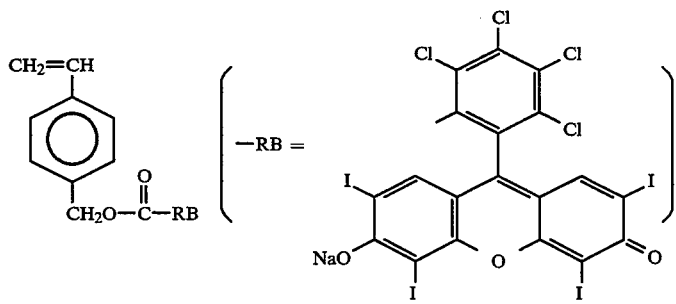

18. The image forming layer according to claim 1, wherein said polymer further comprising at least one copolymerized monomer other than the monomers which are the carboxyl group-containing monomer and the sensitizer moiety-containing monomer.

19. The image forming layer according to claim 18, wherein said copolymerized monomer is selected from the group consisting of acrylic acid esters, acrylamides, methacrylic acid esters, methacrylamides, vinyl ethers, vinyl esters, styrenes and crotonic acid esters.

20. The image forming layer according to claim 1 wherein k represents 1.

* * * * *